US010969838B2

(12) United States Patent
He et al.

(10) Patent No.: US 10,969,838 B2
(45) Date of Patent: Apr. 6, 2021

(54) HYBRID COOLING SYSTEM WITH MULTIPLE OUTLET BLOWERS

(71) Applicant: DELL PRODUCTS, LP, Round Rock, TX (US)

(72) Inventors: Qinghong He, Austin, TX (US); Timothy C. Shaw, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/562,102

(22) Filed: Sep. 5, 2019

(65) Prior Publication Data

US 2021/0072805 A1  Mar. 11, 2021

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01); *H05K 7/20172* (2013.01); *G06F 2200/201* (2013.01)

(58) Field of Classification Search
CPC ......... H01L 23/467; G06F 1/203; G06F 1/20; G06F 2200/201; G06F 1/181; G06F 1/183; H05K 7/20145; H05K 7/20172; H05K 7/2039; H05K 7/20154; H05K 7/20209; H05K 7/20163; H05K 7/20009; H05K 7/20136
See application file for complete search history.

(56) References Cited

U.S. PATENT DOCUMENTS

| | | | | |
|---|---|---|---|---|
| 2,330,938 | A * | 10/1943 | Williams | F04D 29/4246 415/208.3 |
| 3,592,260 | A * | 7/1971 | Berger | F28F 13/06 165/121 |
| 6,034,870 | A * | 3/2000 | Osborn | G06F 1/20 165/121 |
| 7,079,388 | B2 * | 7/2006 | Faneuf | H05K 7/20727 361/679.51 |
| 7,079,394 | B2 * | 7/2006 | Mok | G06F 1/203 361/700 |
| 7,140,734 | B2 * | 11/2006 | Lim | G03B 21/16 353/61 |
| 7,649,736 | B2 * | 1/2010 | Hongo | G06F 1/203 165/104.21 |
| 8,142,147 | B2 * | 3/2012 | O'Connor | F04D 29/4246 415/204 |
| 9,952,636 | B2 | 4/2018 | Montero et al. | |
| 2003/0218863 | A1 * | 11/2003 | Hutchinson | H05K 7/20172 361/695 |

(Continued)

OTHER PUBLICATIONS

Unpublished U.S. Appl. No. 16/395,138, filed Apr. 25, 2019.

*Primary Examiner* — Adam B Dravininkas
(74) *Attorney, Agent, or Firm* — Larson Newman, LLP

(57) ABSTRACT

A portable computer system includes a chassis, a fan, and a seal. The chassis includes an inlet vent to permit ambient air to be drawn from outside the chassis. The fan receives the ambient air via an input aperture, and blows the ambient air through a first outlet aperture to cool a first component of the portable computer system. The seal seals the input aperture to the input vent such that air from inside the chassis is prevented from recirculating through the fan.

17 Claims, 5 Drawing Sheets

(56) References Cited

U.S. PATENT DOCUMENTS

| | | | |
|---|---|---|---|
| 2004/0099404 A1* | 5/2004 | Cipolla | H01L 23/467 165/80.3 |
| 2006/0232934 A1* | 10/2006 | Kusamoto | G06F 1/203 361/697 |
| 2006/0263210 A1* | 11/2006 | Wang | F04D 25/166 415/206 |
| 2007/0160462 A1* | 7/2007 | Tsang | F04D 29/4246 415/143 |
| 2008/0013282 A1 | 1/2008 | Hoss et al. | |
| 2011/0310557 A1* | 12/2011 | Ooe | G06F 1/203 361/692 |
| 2011/0310561 A1* | 12/2011 | Hata | H05K 7/20963 361/697 |
| 2013/0250514 A1* | 9/2013 | Tsao | H05K 7/20145 361/692 |
| 2013/0327507 A1* | 12/2013 | Degner | H05K 7/20145 165/120 |
| 2014/0063726 A1* | 3/2014 | Liu | G06F 1/20 361/679.33 |
| 2016/0117634 A1 | 4/2016 | Kunnathur Ragupathi et al. | |
| 2016/0234356 A1* | 8/2016 | Thomas | H05K 9/0069 |
| 2016/0369811 A1* | 12/2016 | Ling | F04D 29/661 |
| 2018/0166057 A1* | 6/2018 | Jung | G06F 1/1616 |
| 2019/0184868 A1* | 6/2019 | Kim | F04D 29/667 |

* cited by examiner

HYBRID COOLING SYSTEM WITH MULTIPLE OUTLET BLOWERS

FIELD OF THE DISCLOSURE

The present disclosure generally relates to information handling systems, and more particularly relates to a hybrid cooling system with multiple outlet blowers.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include a chassis having an inlet vent to permit ambient air to be drawn from outside the chassis. A fan may receive the ambient air via an input aperture, and blow the ambient air through a first outlet aperture to cool a first component of the system. A seal may seal the input aperture to the input vent such that air from inside the chassis is prevented from recirculating through the fan.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
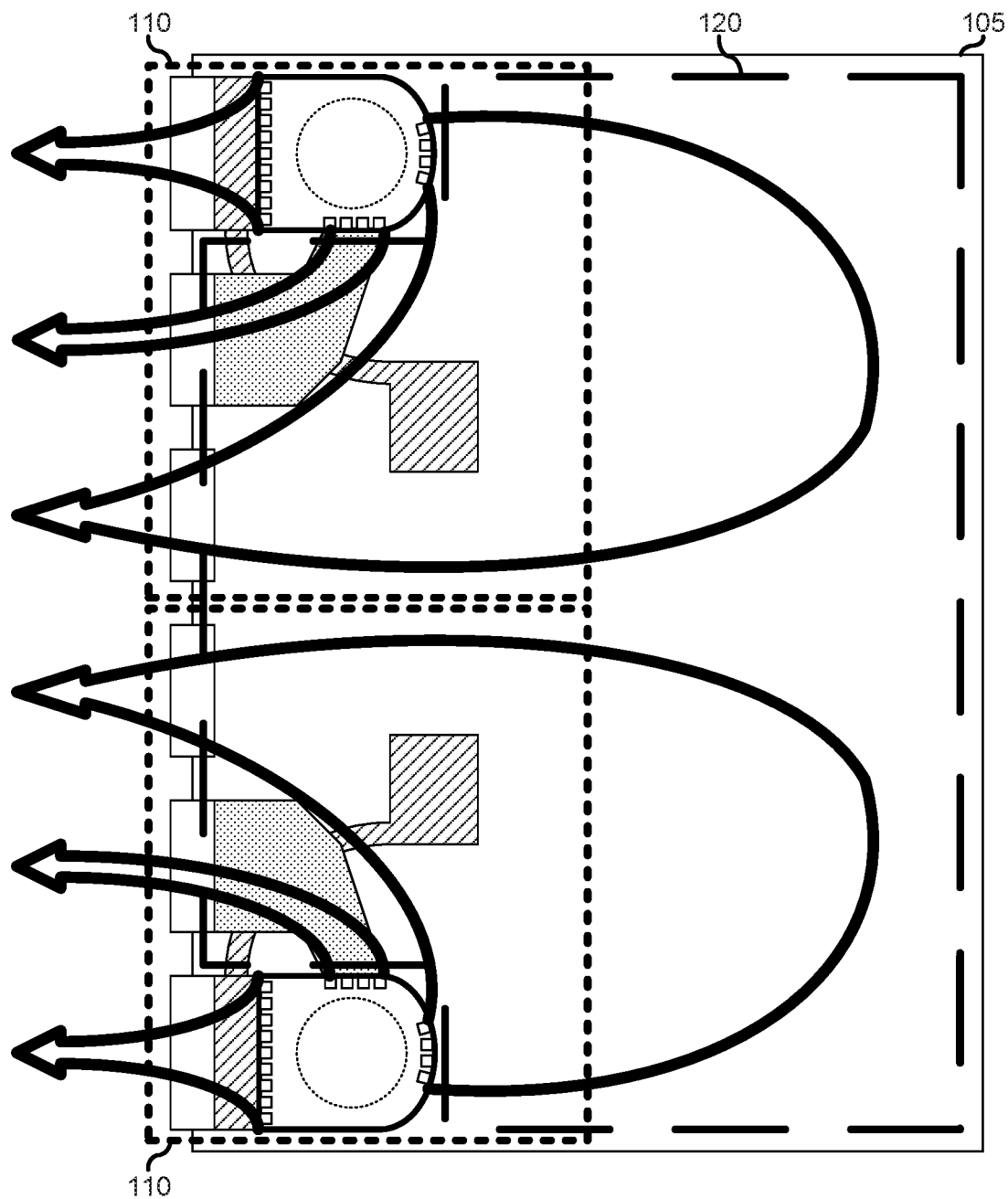
FIG. 1 is a top view of a portion of an information handling system according to an embodiment of the present disclosure.

FIG. 1 illustrates an information handling system 100 including a chassis 105, a pair of multiple outlet blower fan systems 110 (illustrated by dotted lines), and a main circuit board (PCB) 120 (illustrated by a dashed line). In a particular embodiment, information handling system 100 represents a portable computer system. It will be understood that as a portable computer systems become thinner and lighter, air gaps between the components of the portable computer system are becoming increasingly small. For example, a gap between a keyboard or a bottom cover of a portable computer system and the components of a main circuit board may be smaller than 1 millimeter (mm). Because of these small gaps, the heat generated by the components of the main circuit board is more difficult to remove from the system, and may be transferred to the keyboard or the bottom cover. Where a temperature difference (delta T) between components and the external surfaces of the portable computer system may have typically been over 20 C in the past, a delta T of less than 10 C is becoming common, and is likely to be even lower in the future. On the other hand, the amount of heat experienced by a user of the portable computer system before experiencing discomfort remains the same. Thus a manufacturer of portable computer systems may specify a skin temperature limit of, for example 49 C. The lower level of delta T therefore necessitates a lower operating temperature for the components of the portable computer system. Such lower operating temperatures is typically provided by lowering the performance level of the portable computer system.

Typical portable computer systems utilize single-outlet blower fans that blow air drawn from an ambient environment over the components of the portable computer system. In particular, the single-outlet blower fans may be designed into the portable computer system to blow the ambient air over the heating fins of a particularly hot element of the portable computer system, such as one or more CPU, a graphics processor, or memory components. In other designs, the single-outlet blower fans may blow the ambient air over a heat exchanger for a heat transfer system, such as a heat pipe or vapor chamber that is configured to collect heat from the particularly hot elements of the portable system.

Multiple outlet blower fan systems 110 each operate to provide ambient air from an inlet vent on the bottom of chassis 105 to cool the interior of information handling system 100. A cooling fan receives the ambient air via an inlet aperture and blows the air out three outlet apertures. Each output aperture provides the ambient air to remove the heat from a different component or set of components of information handling system 100, and the heated air is blown out of the information handling system via outlet vents in the back of chassis 105. As illustrated, multiple outlet blower fan systems 110 are symmetrical, but this is not necessarily so, and a particular information handling system may include only one multiple outlet blower fan system, or the number of blower vents on each multiple outlet blower fan system may be different, as needed or desired. Further, as illustrated, the components of information handling system 100 are symmetrical, but this is not necessarily so, and a typical PCB of an information handling system will be understood to have components that need cooling that are in differing locations on the PCB. As such, it will be understood that a wide range of design options and cooling requirements may be contemplated utilizing the teachings of the present disclosure. It will be further understood that the airflow provided by multiple outlet blower fan systems 110 may be provided on a top-side of PCB 120, on a bottom-side of the PCB, or on both the top- and bottom-sides of the PCB, as needed or desired.

Figure 2:
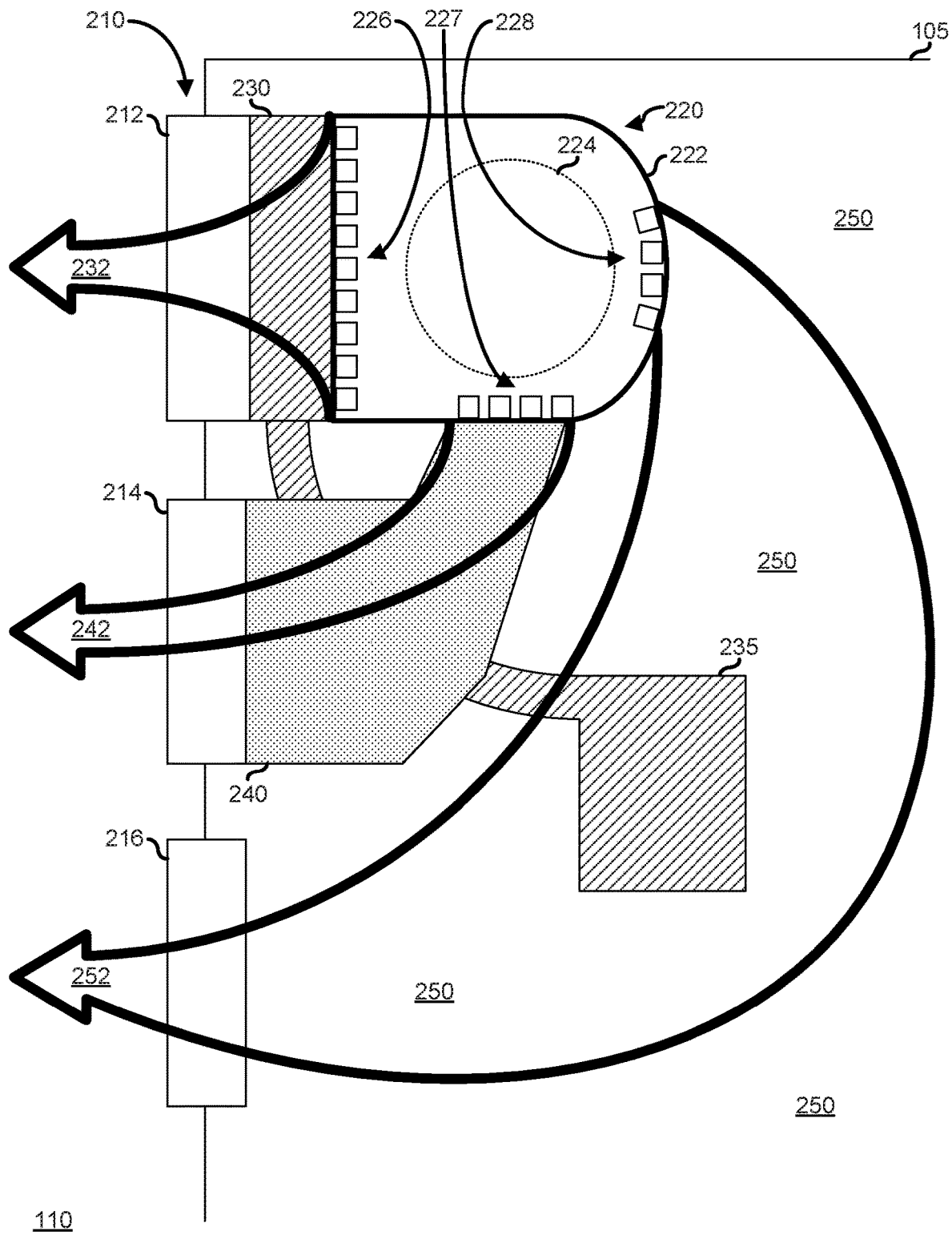
FIG. 2 is a top view of a multiple outlet blower fan system of the information handling system of FIG. 1.

FIG. 2 illustrates a more detailed view of one of multiple outlet blower fan systems 110. Chassis 105 includes an inlet air vent in the bottom of the chassis (not shown), and outlet air vents 210 in the side of the chassis. Multiple outlet blower fan system 110 includes a fan 220 mounted in chassis 105, a heat exchanger 230, a duct 240, and a bulk cooling area 250. Fan 220 includes a fan case 222, an inlet aperture 224 and outlet apertures 226, 227, and 228. Heat exchanger 230 represents a fin stack for removing heat from a heat plate 235 that is collocated with one or more particularly hot component of PCB 120 and that is thermally connected to the heat exchanger, for example by a heat pipe. Thus heat exchanger 230 is provided to remove heat from the one or more components of information handling system 100. As such, fan case 222 includes outlet aperture 226 that provides an airflow 232 of the ambient air to be blown over the heat exchanger 230 to cool the components that are in contact with heat plate 235, and the heated air is exhausted from the interior of information handling system 100 via outlet vent 212. Airflow 232 provides a desired amount of air to pass over heat exchanger 230, based upon the sizes and shapes of outlet aperture 226, the heat exchanger, and outlet vent 212.

Duct 240 represents a channel for directing airflow 242 over selected components of information handling system 100. As such, duct 240 may represent an enclosure fitted over the selected components, air dams and baffles to direct airflow 242 over the selected components, or other mechanisms for directing airflow in an information handling system. Here, fan case 222 includes outlet aperture 227 that provides airflow 242 through duct 240 to cool the selected components, and to exhaust the heated air from the selected components via outlet vent 214. Thus airflow 242 provides a desired amount of air to pass over the selected components, based upon the sizes and shapes of outlet aperture 227, duct 240, and outlet vent 214. In a particular embodiment, duct 240 represents a sealed vapor chamber cooling solution that is implemented to draw heat away from select components of information handling system 100. Here, airflow 242 may not necessarily be channeled through duct 240, but rather is directed over duct 240. Here further, because the surface area of a vapor chamber cooling solution is typically large in comparison to a fin area of heat exchanger 230, the vapor chamber cooling solution may be utilized to efficiently draw heat away from the selected components. In such a case, airflow 242 is directed over duct 240 to remove the heat from away from the duct and out of information handling system 100 via outlet vent 214.

Bulk cooling area 250 represents an unrestricted airflow 252 over a remaining portion of the components of information handling system 100 that are not otherwise cooled by airflows 232 and 242. Here, the remaining components may in general operate at cooler temperatures and thus may not need specific cooling apparatus. Here, fan case 222 includes outlet aperture 228 that provides airflow 252 through bulk cooling area 250 to cool the remaining components, and to exhaust the heated air from the remaining components via outlet vent 216. Thus airflow 252 provides a desired amount of air to pass over the remaining components, based upon the sizes and shapes of outlet aperture 228 and outlet vent 216. Note that a keyboard may be located over PCB 120 and that large portions of bulk cooling area 250 above PCB 120 may encompass large areas of the keyboard. As such, the provision of airflow 252 may be particularly useful in cooling the keyboard, thereby improving the user experience of information handling system 100. Similarly, large portions of bulk cooling area 240 below PCB 120 may encompass large areas of the bottom of chassis 105, and the provision of airflow 252 may also be particularly useful in cooling the bottom surface, again improving the user experience of information handling system 100

By providing fan case 222 with three separate outlet apertures 226, 227, and 228, a system designer has wide flexibility to design a thermal solution for information handling system 100 as needed or desired. For example, more than one heat exchanger or more than one duct may be utilized as needed or desired. Further, a particular outlet aperture may be located such that portions of the airflow from the outlet aperture are directed to different cooling apparatus. For example a particular outlet aperture may have a duct located in a portion of the airflow, while another portion of the airflow is permitted to flow through a bulk cooling area of the information handling system. Further, the use of multiple outlet apertures in a fan case may necessitate other modifications to a fan, such as the use of a larger fan blade, the spinning of the fan blade at a higher speed, or other such modifications as may be needed to supply a larger amount of ambient air to the various airflows than would be provided by a fan with a single outlet aperture. It has been determined by the inventors of the present disclosure that, where a portable computer system utilizes multiple outlet blower fan solution 110, information handling system 100 may dissipate 13-18 Watts (W) more power than a similar portable computer system that utilizes single-outlet blower fan solutions.

In a particular embodiment, a fan is rigidly mounted within a chassis at a particular distance above the bottom of the chassis to permit air to freely flow to an inlet aperture. However, in such an embodiment, air may be drawn from a bulk cooling area of the information handling system, essentially recirculating heated air, rather than drawing ambient air through the inlet vent. This may particularly be so when the inlet vent is not adequately kept clear of dust and other obstructions. Here, in extreme cases, where the inlet vent is completely blocked, all of the air drawn in by the fan may come from the gap beneath the fan. Here, in effect, ambient air would be drawn in a bulk area outlet vent, would be pre-heated by the cooler components, and then the pre-heated air would be drawn through the fan to be provided to the heat exchanger and duct airflows. This would likely result in a marked decrease in the cooling performance of the information handling system.

Figure 3:
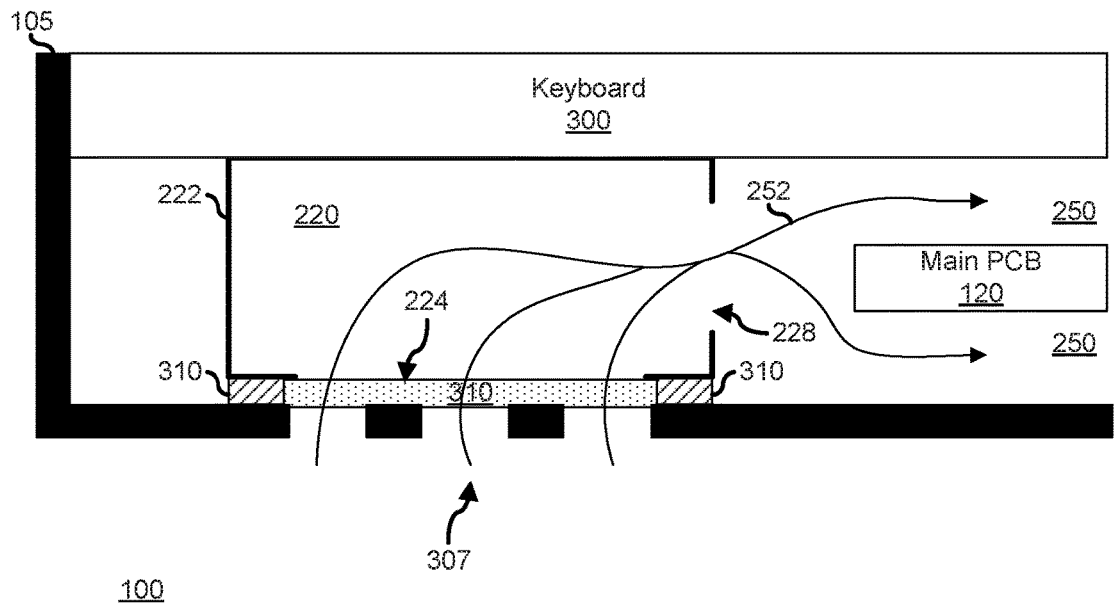
FIG. 3 is a cross sectional view of the information handling system of FIG. 1.

FIG. 3 illustrates an embodiment of information handling system 100 as viewed edge-on. Here, chassis 105 is illustrated as including an inlet vent 307 on a bottom surface of the chassis, with fan 220 shown mounted above the bottom of the chassis to permit air to freely flow to inlet aperture 224. For convenience, FIG. 3 illustrates airflow 252 flowing into inlet aperture 224 from inlet vent 307, and flowing out outlet aperture 228 into bulk cooling area 250 over the top and bottom surfaces of PCB 120. It should be understood that airflows 232 and 242 likewise flow into inlet aperture 224 from inlet vent 307, and flowing out their respective outlet apertures 226 and 227. Here, rather than being rigidly mounted within chassis 105 at a particular distance above the bottom of the chassis, fan 220 is mounted to chassis 105 with a seal 310 between the chassis bottom and the bottom of fan case 222.

Seal 310 is provided around a perimeter of input aperture 224 to prevent the free flow of air from bulk cooling area 250, thereby ensuring that airflow 252 and the other airflows associated with multiple outlet blower fan system 110 are sourced only with cool ambient air from outside of information handling system 100. Seal 310 preferably provides a seal between chassis 105 and fan case 222 such that all of the air received by fan 220 via inlet aperture 224 is received from inlet vent 307, and not from inside of information handling system 100. The use of seal 310 between the bottom of chassis 105 and the bottom of fan case 222 can result in a smaller distance between the chassis and the fan case, thereby permitting a reduction in the overall depth of information handling system 100. Thus, where information handling system 100 represents a portable computer system, the portable computer system may de designed to a slimmer depth.

An example of seal 310 includes an adhesive backed foam or adhesive sealant material, a gasket, an O-ring, or the like. Seal 310 can be adhered to either chassis 105 or fan case 220 prior to the assembly of fan 220 into information handling system 100. Seal 310 may be provided around a portion of the bottom side of fan 220 in addition to the perimeter of inlet aperture 224. For example, seal 310 may be provided around a perimeter of fan 220, or a portion thereof, so long as the entirety of inlet aperture 224 is sealed to only permit inlet air from inlet vent 307.

FIG. 3 illustrates a keyboard 300 located directly atop fan 120, but this is not necessarily so, and there may be a gap between the keyboard and the fan, as needed or desired. By eliminating air recirculation utilizing seal 310, the inventors of the present disclosure have determined that, where a portable computer system utilizes information handling system 100 may dissipate 6-8 W more power than a similar portable computer system that does not include a seal and thus permits air recirculation. The elimination of air recirculation utilizing seal 310, in combination with the use of multiple outlet blower fan system 110 provides for the dissipation of 20-22 W more power.

As a result, the performance level of information handling system 100 may be increased without increasing the discomfort of the user of the information handling system. The use of a seal to seal an inlet aperture of a fan to an inlet vent of an information handling system will provide similar benefits, even if the fan so sealed is a single-outlet fan, and use of single- or double-outlet fans with a seal between the inlet aperture of the fan and the inlet vent in the chassis is therefore specifically contemplated in the present disclosure.

Figure 4:
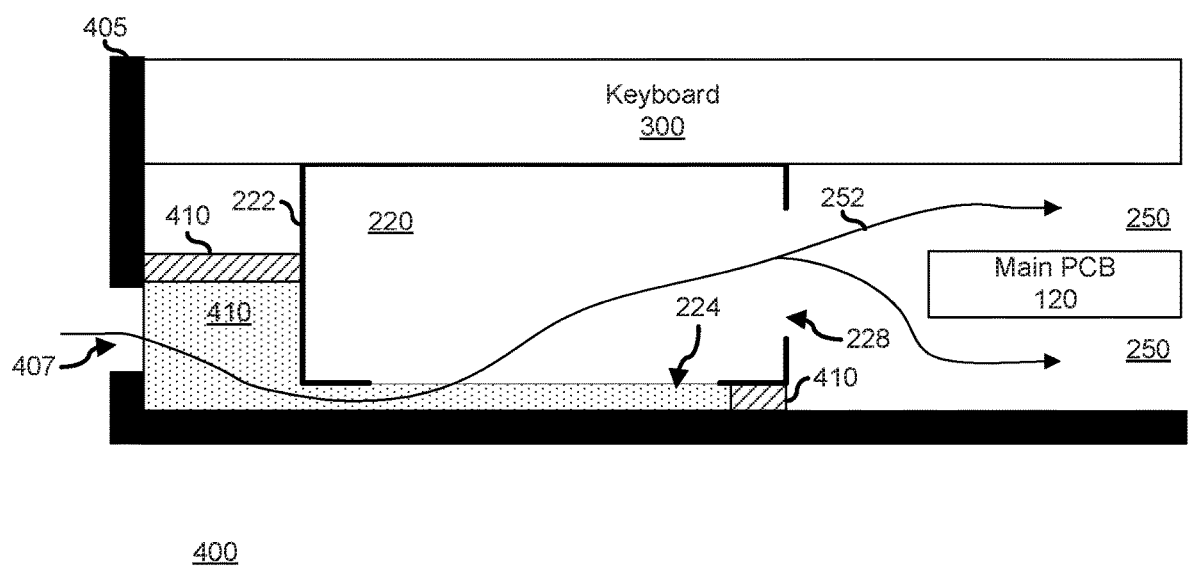
FIG. 4 is a cross sectional view of an information handling system according to another embodiment of the present disclosure.

FIG. 4 illustrates an embodiment of information handling system 400, similar to information handling system 100, as viewed edge-on. Here, a chassis 405 is illustrated as including an inlet vent 407 on a side surface of the chassis, with fan 220 shown mounted above the bottom of the chassis to permit air to freely flow to inlet aperture 224. For convenience, FIG. 4 illustrates airflow 252 flowing into inlet aperture 224 from inlet vent 307, and flowing out outlet aperture 228 into bulk cooling area 250 over the top and bottom surfaces of PCB 120. It should be understood that airflows 232 and 242 likewise flow into inlet aperture 224 from inlet vent 407, and flowing out their respective outlet apertures 226 and 227. Here, fan 220 is rigidly mounted within chassis 105 at a particular distance above the bottom of chassis 405, and is also fitted with a seal 410 between the bottom and side of the chassis and the bottom and side of fan case 222.

Seal 410 is provided such that input aperture 224 such that airflow 252 and the other airflows associated with multiple outlet blower fan system 110 are sourced only with cool ambient air from outside of information handling system 100. Seal 310 preferably provides a seal between chassis 405 and fan case 222 such that all of the air received by fan 220 via inlet aperture 224 is received from inlet vent 407, and not from inside of information handling system 100. Here, the use of seal 410 between the bottom of chassis 405 and the bottom of fan case 222 again necessitates a small distance be maintained between the fan case and the chassis, in order to permit airflow 252 to flow under fan 220.

Because inlet air vent 407 is situated in the side of chassis 405, seal 410 also has a more complex structure to form a duct between the inlet air vent and inlet aperture 224. Seal 410 can be adhered to either chassis 405 or fan case 220 prior to the assembly of fan 220 into information handling system 100. Seal 410 may be provided around a portion of the bottom side of fan 220 in addition to the perimeter of inlet aperture 224. For example, seal 410 may be provided around a perimeter of fan 220, or a portion thereof, so long as the entirety of inlet aperture 224 is sealed to only permit inlet air from inlet vent 407. FIG. 4 illustrates keyboard 300 located directly atop fan 120, but this is not necessarily so, and there may be a gap between the keyboard and the fan, as needed or desired.

Figure 5:
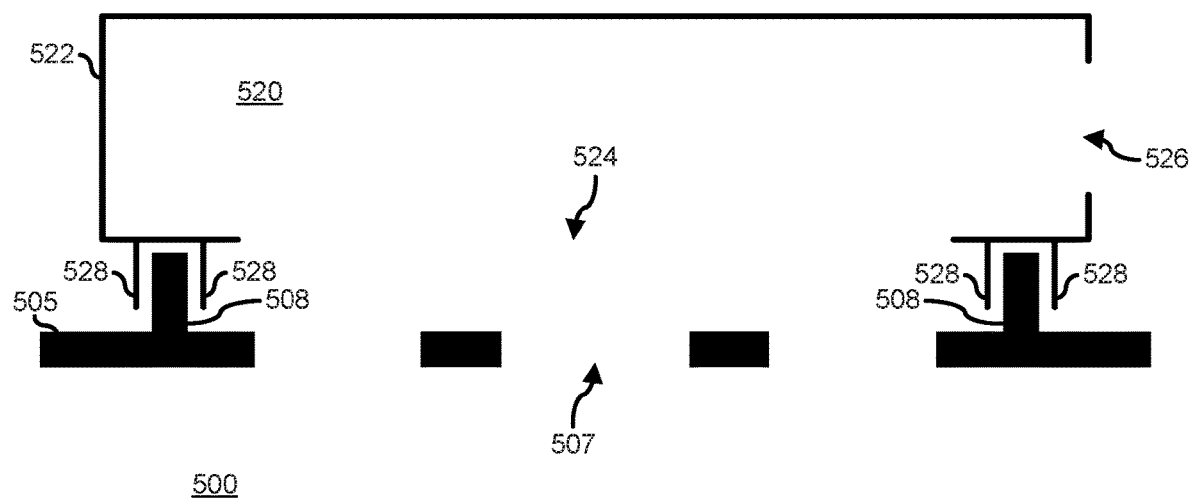
FIG. 5 is a cross sectional view of an information handling system according to another embodiment of the present disclosure.

FIG. 5 illustrates an information handling system 500 including a chassis 505 similar to chassis 105, and a fan 520 similar to fan 520. Chassis 505 has an inlet vent 507 that permits ambient air to be drawn into an inlet aperture 524 of fan 520 to be blown out an outlet aperture 526 of the fan. Here, the sealing of inlet aperture 524 to inlet vent 507 is provided by a tongue-and-groove mechanism. As such, chassis 505 is illustrated as including a tongue 508 around a perimeter of inlet vent 507. Fan 520 includes a fan case 522 that includes a groove structure 528 around a perimeter of inlet aperture 524. Tongue 508 and groove structure 528 are designed to interface together to restrict airflow from a bulk area of information handling system 500, and to maximize the airflow from inlet vent 507.

Here, tongue 508 and groove structure 528 are illustrated as having a gap that could be thought to permit recirculated air to enter inlet aperture 524 from the bulk area of information handling system 500, but this is for the purposes of clarity of illustration, and it should be understood that the tongue and the groove structure would be designed with a tight tolerance so as to minimize airflow from the bulk area of the information handling system. For example, tongue 508 and groove structure 528 may be designed to a tight tolerance with each other to provide a press-fit, such that when fitted together, no air is permitted into inlet aperture 524 from the bulk area of information handling system 500.

In another example, tongue 508 and groove structure 528 may be designed to a looser tolerance with each other, and a sealant can be provided in the groove structure prior to assembly in order to fully seal inlet aperture 524 from receiving recirculated air from the bulk area of information handling system 500. The locations of a tongue and a groove structure may alternatively be swapped such that a chassis includes a groove structure and a fan case includes a tongue. The mechanical sealing function as provided by the present embodiment may similarly be provided by a tongue on both the fan case and the chassis, and a groove structure that retains both sides of a complementary tongue is not necessary.

Figure 6:
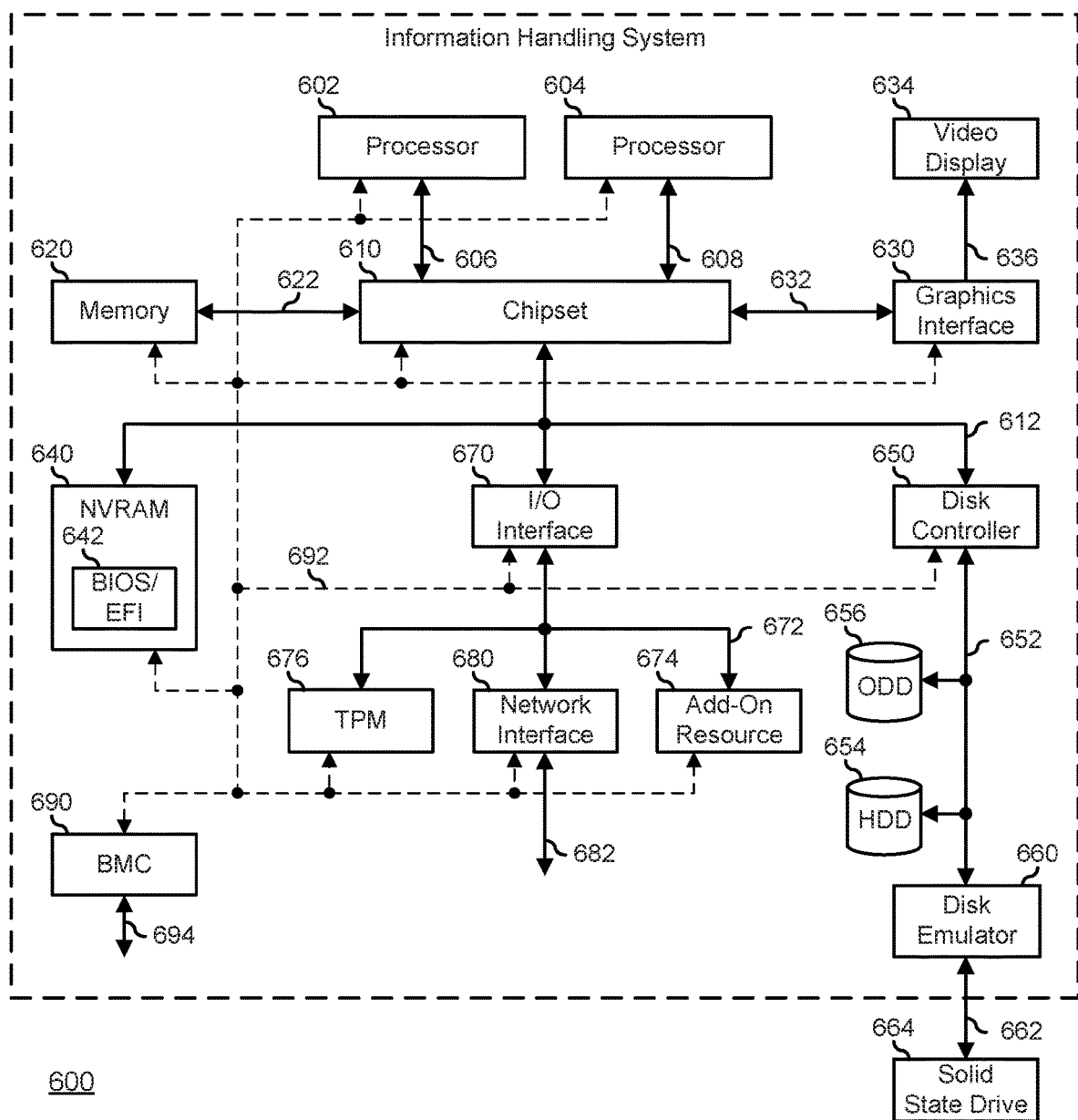
FIG. 6 is a block diagram of a general information handling system according to at least one embodiment of the disclosure.

FIG. 6 illustrates a generalized embodiment of information handling system 600. For purpose of this disclosure information handling system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a portable computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 includes processors 602 and 604, a chipset 610, a memory 620, a graphics adapter 630 connected to a video display 634, a non-volatile RAM (NV-RAM) 640 that includes a basic input and output system/extensible firmware interface (BIOS/EFI) module 642, a disk controller 650, a hard disk drive (HDD) 654, an optical disk drive 656, a disk emulator 660 connected to a solid state drive (SSD) 664, an input/output (I/O) interface 670 connected to an add-on resource 674 and a trusted platform module (TPM 676, a network interface 680, and a baseboard management controller (BMC) 690. Processor 602 is connected to chipset 610 via processor interface 606, and processor 604 is connected to the chipset via processor interface 608. In a particular embodiment, processors 602 and 604 are connected together via a high-capacity coherent fabric, such as a HyperTransport link, a QuickPath Interconnect, or the like.

Chipset 610 represents an integrated circuit or group of integrated circuits that manages the data flows between processors 602 and 604 and the other elements of information handling system 600. In a particular embodiment, chipset 610 represents a pair of integrated circuits, such as a northbridge component and a southbridge component. In another embodiment, some or all of the functions and features of chipset 610 are integrated with one or more of processors 602 and 604. Memory 620 is connected to chipset 610 via a memory interface 622. An example of memory interface 622 includes a Double Data Rate (DDR) memory channel and memory 620 represents one or more DDR Dual In-Line Memory Modules (DIMMs). In a particular embodiment, memory interface 622 represents two or more DDR channels. In another embodiment, one or more of processors 602 and 604 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 620 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 630 is connected to chipset 610 via a graphics interface 632, and provides a video display output 636 to a video display 634. An example of a graphics interface 632 includes a Peripheral Component Interconnect-Express (PCIe) interface and graphics adapter 630 can include a four lane (×4) PCIe adapter, an eight lane (×8) PCIe adapter, a 16-lane (×16) PCIe adapter, or another configuration, as needed or desired. In a particular embodiment, graphics adapter 630 is provided down on a system printed circuit board (PCB). Video display output 636 can include a Digital Video Interface (DVI), a High-Definition Multimedia Interface (HDMI), a DisplayPort interface, or the like, and video display 634 can include a monitor, a smart television, an embedded display such as a laptop computer display, or the like.

NV-RAM 640, disk controller 650, and I/O interface 670 are connected to chipset 610 via an I/O channel 612. An example of I/O channel 612 includes one or more point-to-point PCIe links between chipset 610 and each of NV-RAM 640, disk controller 650, and I/O interface 670. Chipset 610 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 640 includes BIOS/EFI module 642 that stores machine-executable code (BIOS/EFI code) that operates to detect the resources of information handling system 600, to provide drivers for the resources, to initialize the resources, and to provide common access mechanisms for the resources. The functions and features of BIOS/EFI module 642 will be further described below.

Disk controller 650 includes a disk interface 652 that connects the disc controller to a hard disk drive (HDD) 654, to an optical disk drive (ODD) 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits a solid-state drive (SSD) 664 to be connected to information handling system 600 via an external interface 662. An example of external interface 662 includes a USB interface, a proprietary interface, or a combination thereof. Alternatively, solid-state drive 664 can be disposed within information handling system 600.

I/O interface 670 includes a peripheral interface 672 that connects the I/O interface to add-on resource 674, to TPM 676, and to network interface 680. Peripheral interface 672 can be the same type of interface as I/O channel 612, or can be a different type of interface. As such, I/O interface 670 extends the capacity of I/O channel 612 when peripheral interface 672 and the I/O channel are of the same type, and the I/O interface translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a network communication device disposed within information handling system 600, on a main circuit board of the information handling system, integrated onto another component such as chipset 610, in another suitable location, or a combination thereof. Network interface device 680 includes a network channel 682 that provides an interface to devices that are external to information handling system 600. In a particular embodiment, network channel 682 is of a different type than peripheral channel 672 and network interface 680 translates information from a format suitable to the peripheral channel to a format suitable to external devices. In a particular embodiment, network interface 680 includes a network interface card (NIC) or host bus adapter (HBA), and an example of network channel 682 includes an InfiniBand channel, a Fibre Channel, a Gigabit Ethernet channel, a proprietary channel architecture, or a combination thereof. In another embodiment, network interface 680 includes a wireless communication interface, and network channel 682 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 682 can be connected to an external network resource (not illustrated). The network resource can include another information handling system, a data storage system, another network, a grid management system, another suitable resource, or a combination thereof.

BMC 690 is connected to multiple elements of information handling system 600 via one or more management interface 692 to provide out of band monitoring, maintenance, and control of the elements of the information handling system. As such, BMC 690 represents a processing device different from processor 602 and processor 604, which provides various management functions for information handling system 600. For example, BMC 690 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 690 can vary considerably based on the type of information handling system. BMC 690 can operate in accordance with an Intelligent Platform Management Interface (IPMI). Examples of BMC 690 include an Integrated Dell Remote Access Controller (iDRAC). Management interface 692 represents one or more out-of-band communication interfaces between BMC 690 and the elements of information handling system 600, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 600, that is apart from the execution of code by processors 602 and 604 and procedures that are implemented on the information handling system in response to the executed code. BMC 690 operates to monitor and maintain system firmware, such as code stored in BIOS/EFI module 642, option ROMs for graphics interface 630, disk controller 650, add-on resource 674, network interface 680, or other elements of information handling system 600, as needed or desired. In particular, BMC 690 includes a network interface 694 that can be connected to a remote management system to receive firmware updates, as needed or desired. Here, BMC 690 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 690 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 690, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 690 is included on a main circuit board (such as a baseboard, a motherboard, or any combination thereof) of information handling system 600, or is integrated onto another element of the information handling system such as chipset 610, or another suitable element, as needed or desired. As such, BMC 690 can be part of an integrated circuit or a chip set within information handling system 600 (such as iDRAC). BMC 690 may operate on a separate power plane from other resources in information handling system 600. Thus BMC 690 can communicate with the management system via network interface 694 while the resources of information handling system 600 are powered off. Here, information can be sent from the management system to BMC 690 and the information can be stored in a RAM or NV-RAM associated with the BMC. Information stored in the RAM may be lost after power-down of the power plane for BMC 690, while information stored in the NV-RAM may be saved through a power-down/power-up cycle of the power plane for the BMC.

The term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A portable computer system, comprising:
   a chassis including an inlet vent to permit ambient air to be drawn from outside the chassis;
   a fan that receives the ambient air via an input aperture, that blows the ambient air through a first outlet aperture to cool a first component of the portable computer system, that blows the ambient air through a second outlet aperture to cool a second component of the portable computer system, and that blows the ambient air through a third outlet aperture to cool a third component of the portable computer system; and
   a seal to seal the input aperture to the input vent such that air from inside the chassis is prevented from recirculating through the fan.

2. The portable computer system of claim 1, wherein the inlet aperture is in a bottom of the fan and the inlet vent is in a bottom of the chassis.

3. The portable computer system of claim 2, wherein the seal is provided around a perimeter of the inlet aperture.

4. The portable computer system of claim 2, wherein the seal is provided around a perimeter of the fan.

5. The portable computer system of claim 1, wherein the seal includes one of an adhesive backed foam, and adhesive sealant material, a gasket, and an O-ring.

6. The portable computer system of claim 1, wherein the seal is made by tongue-and-groove structures on the chassis and the fan.

7. The portable computer system of claim 1, wherein the inlet aperture is in a bottom of the fan and the inlet vent is in a side of the chassis.

8. A method, comprising:
   drawing, by a fan of a portable computer system, ambient air through an inlet aperture of the fan, wherein the ambient air is drawn from outside a chassis of the portable computer system via an inlet vent of the chassis, and wherein the inlet aperture is sealed by a seal to the inlet vent such that air from inside the chassis is prevented from recirculating through the fan;
   blowing, by the fan, the ambient air through a first outlet aperture of the fan to cool a first component of the portable computer system;
   blowing the ambient air through a second outlet aperture of the fan to cool a second component of the portable computer system; and
   blowing, by the fan, the ambient air through a third outlet aperture to cool a third component of the portable computer system.

9. The method of claim 8, wherein the inlet aperture is in a bottom of the fan and the inlet vent is in a bottom of the chassis.

10. The method of claim 9, wherein the seal is provided around a perimeter of the inlet aperture.

11. The method of claim 9, wherein the seal is provided around a perimeter of the fan.

12. The method of claim 8, wherein the seal includes one of an adhesive backed foam, and adhesive sealant material, a gasket, and an O-ring.

13. The method of claim 8, wherein the seal is made by tongue-and-groove structures on the chassis and the fan.

14. The method of claim 8, wherein the inlet aperture is in a bottom of the fan and the inlet vent is in a side of the chassis.

15. A portable computer system, comprising:
- a chassis including first and second inlet vents to permit ambient air to be drawn from outside the chassis;
- a first fan that receives the ambient air via a first input aperture, that blows the ambient air through a first outlet aperture to cool a first component of the portable computer system, that blows the ambient air through a second outlet aperture to cool a second component of the portable computer system, and that blows the ambient air through a third outlet aperture to cool a third component of the portable computer system;
- a first seal to seal the first input aperture to the first input vent such that air from inside the chassis is prevented from recirculating through the first fan;
- a second fan that receives the ambient air via a second input aperture, that blows the ambient air through a fourth outlet aperture to cool a fourth component of the portable computer system, and that blows the ambient air through a fifth outlet aperture to cool a fifth component of the portable computer system; and
- a second seal to seal the second input aperture to the second input vent such that air from inside the chassis is prevented from recirculating through the second fan.

16. The portable computer system of claim 15, wherein the first and second seals include one of an adhesive backed foam, and adhesive sealant material, a gasket, and an O-ring.

17. The portable computer system of claim 15, wherein the first and second seals are made by tongue-and-groove structures on the chassis and the first and second fans.

* * * * *